United States Patent [19]
Ogawa

[11] Patent Number: 6,041,840
[45] Date of Patent: Mar. 28, 2000

[54] VACUUM LAMINATION DEVICE AND A VACUUM LAMINATION METHOD

[75] Inventor: Akihiko Ogawa, Ohbu, Japan

[73] Assignee: Kabushiki Kaisha Meiki Seisakusho, Ohbu, Japan

[21] Appl. No.: 09/074,375

[22] Filed: May 8, 1998

[30] Foreign Application Priority Data

May 22, 1997 [JP] Japan .................................. 9-132056

[51] Int. Cl.[7] .................................................. B32B 31/00
[52] U.S. Cl. ........................................ 156/382; 156/285
[58] Field of Search ................................... 156/382, 107, 156/109, 285

[56] References Cited

FOREIGN PATENT DOCUMENTS

| 55-13341 | 1/1980 | Japan . |
|---|---|---|
| 63-295218 | 12/1988 | Japan . |
| 63-299895 | 12/1988 | Japan . |
| 4-52200 U | 5/1992 | Japan . |

*Primary Examiner*—Francis J. Lorin
*Attorney, Agent, or Firm*—Oliff & Berridge, PLC

[57] ABSTRACT

Film bodies are provided on opposing surfaces of an upper platen and a lower platen, and a frame is provided on the lower platen. The frame forms a forming room when the upper platen and the lower platen are brought close to each other. One film body is fixed on a heater having a given flexibility and rigidity. The upper platen includes a flow path through which a coolant is circulated. A recessed portion is formed on the lower surface of the upper platen under the film body. The material to be formed is pressurized by the film bodies due to a pressure reduction caused by depressurizing the forming room without reducing its capacity, in a state in which the film body is separated from the recessed portion and heated by the heater. Then, the material is cooled while in tight contact with the recessed portion.

5 Claims, 6 Drawing Sheets

VACUUM LAMINATION DEVICE AND A VACUUM LAMINATION METHOD

BACKGROUND OF THE INVENTION

1. Field of Invention

This invention relates to a lamination device to laminate a material to be formed by heating and pressurizing under a vacuum atmosphere.

2. Background of Related Art

For instance, in the case of manufacturing a printed circuit board, there is a process where an insulating substrate made from thermosetting resin such as a phenol resin or an epoxy resin or an insulating base film having flexibility made from a thermoplastic resin such as a polyimid is laminated with an electric conductive layer such as copper foils patterned or to be etched at a later process (hereinafter, the former is referred to merely as lamination substrate and the latter is referred to as flexible lamination substrate). In the case of forming a lamination substrate, an insulating substrate and copper foils are heated and pressurized under a vacuum atmosphere, the insulating substrate is plasticized due to a chemical reaction of thermosetting resin and laminated with the copper foils by adhesion, and further chemical reaction causes the insulating substrate adhered with the copper foils to be hardened. Further, in the case of forming a flexible laminating substrate too similarly an insulating base film and copper foils are heated and pressurized under a vacuum atmosphere and make the insulating base film plasticized to be laminated with copper foils due to adhesion. That is, in a process where an electric conductive layer such as copper foils is laminated, a material to be formed itself such as insulating substrate made of a thermoplastic resin or an insulating base film becomes an adhesive.

Further, to these lamination substrate and flexible lamination substrate, there is, in order to protect copper foils laminated from etching, metal plating and soldering, a process of heat-pressure-adhering on the electric conductive layer surface laminated with a film-like photoresist-forming layer made of a supporting film and a photo-sensitive layer. The photoresist-forming layer becomes adhesive by being heated and is laminated on the surface of copper foils under being pressurized.

In thus formed printed circuit boards, in recent years integrated density has become higher and in accordance with the development of surface treatment thereof the constitution thereof has been also changed. Eventually, a multiple layer printed circuit board or a multiple layer flexible printed circuit board having more than three layers of electric conducting patterns including a surface conducting layer has been often used. In the case where such multiple layer printed circuit board is manufactured, a build-up method has been employed, in which, to the conducting layer of the lamination substrate or the flexible lamination substrate, further an insulating substrate or an insulating base film and a conducting layer are in turn laminated.

By the way, at the time of carrying out the process of the above lamination of the conducting layer or the heat-pressure adhering of a film-like photoresist-forming layer, bubbles consisting of some volatile ingredients of a material to be formed are apt to remain between the lamination substrate or the flexible lamination substrate and the copper foils or between the laminated copper foils and the film-like photoresist-forming layer and generate voids. Thus generated voids may swell at the time of a post-treatment under a high temperature, for example a molten solder bath etc., and give some damages to the laminated copper foils and the film-like laminated photoresist-forming layer, so that there is an anxiety to cause malfunction of the protection and insulation, further including electric conductivity.

From the above, in the case where every lamination is carried out in every kind of material to be formed by heating and pressurizing, in order to avoid the generation of voids, a lamination method under a vacuum atmosphere has been conventionally carried out.

As a conventional vacuum lamination device for laminating a material to be formed which consists of a plurality of plate-like, sheet-like or film-like materials, as disclosed in the Japanese patent laid-open publication Nos. 295218/1988 and 299895/1988, it has been known that a cylindrical rubber is provided inside a heating vessel or a rubber sheet is provided inside a vacuum chamber which is free of opening and closing, and a vacuum pump is connected inside the cylindrical rubber or between the rubber sheets. In these vacuum lamination devices, a material to be formed is disposed inside the cylindrical rubber or between rubber sheet, a vacuum forming chamber is formed by sealing the cylindrical rubber or the rubber sheet and the vacuum forming chamber is depressurized to pressurize the material to be formed by the cylindrical rubber or the rubber sheet. In the Japanese patent laid-open publication No. 295218/1988, a stage material is heated by the heating vessel connected to the heating device. Further, in the Japanese patent laid-open publication No. 299895/1988, a stage material is heated by the stationary chamber and the movable chamber heated by a heating mechanism.

Further, as a conventional vacuum lamination method, as disclosed in the Japanese patent publication No. 13341/1980, it has been known that, by making a photoresist-forming layer bonded on a film supporter arranged adjacent to the surface of a circuit board, depressurizing the absolute pressure on the area between the surface of the circuit board and the photoresist-forming layer and on the film supporter to less than 1 atmosphere, pressurizing the film supporter which functions as a pressure transmitting layer to pressurize the photoresist-forming layer on the surface of the circuit board, and softening the photoresist-forming layer by heating, the laminating is carried out.

Further, as another conventional vacuum lamination device, for instance, as disclosed in the Japanese utility model publication No. 52200/1992, a vacuum hot press has been known, in which a plurality of heating plates are disposed between a stationary base and a movable base provided, which is free of opening and closing to the stationary base and a vacuum chamber is formed by enclosing a space where the movable base displaces. In such a vacuum hot press, in general, in every heating plate a temperature regulating fluid passage is formed, and, by passing a heating medium such as pressured vapor or heated oil through the passage, every material to be formed inserted between the respective heating plates is pressurized and heated simultaneously. And, by passing a coolant such as cooling water interchangeably with a heating medium through this temperature regulating fluid passage or through another temperature regulating fluid passage for supplying the coolant provided on each heating plate, a heated material to be formed is cooled.

By the way, in the device (hereinafter referred to as vacuum laminator) used in the vacuum lamination method of the Japanese patent laid-open publication Nos. 295218/1988, 299895/1988 or the Japanese patent publication No. 13341/1980, there have been problems in which, before a thermosetting resin is pressurized, due to a heat transmission and a radiation heat in the chamber, a hardening reaction advances, so that a malfunction in adhering to a material to be formed such as copper foils is generated and eventually an adhering strength is not guaranteed.

Further, since the material to be formed which was heated by the heating device or the heating mechanism is made to be gradually cooled to the temperature, which makes the material to be formed stable, even after a lamination process is completed, the heat at the time of being heated remains in the material to be formed, in addition, since a coefficient of thermal expansion is different between the electric conducting layer such as copper foils and, the insulating substrate or the insulating base film made of a thermosetting resin or the film-like photoresist-forming layer, there has been a problem to generate defects such as wrinkles, drawn portions and deformation due to thermal shrinking by an abrupt and uneven descent of the temperature.

Further, in the case where the material to be formed is highly dependent on the temperature like the film-like photoresist-forming layer which bears adhesive property by being heated as mentioned above, prior to being fallen in a vacuum atmosphere a portion getting in touch with the material is adhered and there has happened to generate a problem in which malfunction occurs in air sucking between the laminated copper foils and the film-like photoresist-forming layer. In addition, there has happened to generate a problem of much advancing in plasticizing before being pressurized, which causes the lamination to generate wrinkles or decrease positioning precision. And, these problems cause the yield rate of the products to decrease.

On the other hand, in the vacuum hot press as disclosed in the Japanese utility model publication No. 52200/1992, since the heating medium or cooling medium is supplied through the temperature regulating fluid passage provided in each heating plate, heat capacity is great, and the molding cycle can not be shortened, further there has been a problem in which the heat efficiency is inferior and expensive in cost and the increase of productivity can not be realized.

SUMMARY OF THE INVENTION

The present invention has been made for solving the above problems, and the object of which is to provide a vacuum lamination device and a method of vacuum lamination, in which, in accordance with the temperature condition of the material to be formed, an appropriate lamination of a plurality of plate-, sheet- or film-like materials to be formed can be carried out appropriately, form a firm lamination of laminated products without generating any wrinkle and increase a yield.

In order to attain the above object, in the invention of a lamination device, it comprises an upper platen and a lower platen which are disposed opposing each other and able to come close and be separated, a film body formed on each opposing surface of the upper and lower platens, a frame which forms a forming room for accommodating the material to be formed at the time of coming close of both platens, a heating means provided on at least either one film body provided on the upper platen or the lower platen, a recessed portion having a given spacing between the film body with the heating means and the opposing surface of the upper platen and/or lower platen provided with the film body, a cooling means for cooling the recessed portion, a depressurization means to depressurize the forming room, a film body operating means to operate controllably the film body, at a given timing, in such a manner as the material to be formed accommodated in the forming room in such a state as being separated from the recessed portion is pressurized and the laminated material to be formed is made contact tightly to the recessed portion of the upper platen and/or lower platen.

The invention of the vacuum lamination device is characterized in that, in order to attain the above object, in the invention, the heating means has the flexibility able to adhere tightly to the recessed portion and the rigidity able to function as a base plate at the time of pressurizing the material to be formed accommodated in the forming room.

The invention of the vacuum lamination method in order to attain the above object, a material to be formed is disposed between the film bodies provided on each of opposing surface of the upper and lower platens which are opposing each other and able to come close or be separated, wherein, by coming close of the upper and lower platens, a forming room accommodating the material to be formed is formed, it is depressurized without changing the capacity of the forming room, the material to be formed is pressurized by both of the film bodies and heated in a state where the material to be formed is separated at least from the upper platen and/or lower platen on which the cooling means is provided, and the film bodies are operated in such a manner as the film bodies contact tightly to the material to be formed between the upper platen or the lower platen.

According to the lamination device, the material to be formed is inserted in the frame in a state where the upper and lower platens are separated, when the upper platen and the lower platen are made to come close, a forming room is formed by the film bodies of both platens and the frame. Then, such a room is depressurized by pressure reducing means while both film bodies contacting tightly to the both platens respectively by the film body operating means in such a manner as the capacity of the forming room is not reduced. Subsequently, by releasing the tight contact of both film bodies to the both platens by the film bodies operating means respectively, while separating the film body from the upper platen and/or lower platen in which the cooling means is provided, the capacity of the forming room is reduced, and the material to be formed is pressurized by the both film bodies. Simultaneously with this pressurization to the material to be formed, the material to be formed is heated by the heating means provided in the film body. Thereby, the materials to be formed are made to be laminated with each other. After that, the heating by the heating means is stopped, and the laminated products are cooled by controlling the film body operation means in such a manner as the laminated products contact tightly through the film body provided in the heating means to the recessed portion of the upper platen and/or lower platen on which the cooling means is provided through the cooling means. Thereby, the temperature of the material to be formed of each laminated products descends evenly to cause thermal shrinkage, and the laminated products are stabilized without forming any wrinkle. Further, since the radiation heat in the forming room is also removed, there is no chance for the material to be formed to be heated before being pressurized.

In the invention of the vacuum lamination apparatus, due to the flexibility of the heating means, it contacts tightly to the recessed portion where the cooling means is provided, and the laminated products are cooled stably without any deformation. Further, since the heating means has rigidity, the material to be formed can be pressurized stably while separating the film body from the upper platen and/or lower platen on which the cooling means is provided and heated effectively.

In the invention of the vacuum lamination apparatus of claim 3, the material to be formed is disposed between the film bodies provided on the opposing surfaces of the upper platen and the lower platen and the forming room is formed, in which the material to be formed is accommodated surrounded with the film bodies of the upper and lower platens which come close and the frame. Then, the forming room is depressurized while both film bodies being kept in contacting tightly to the upper and lower platens in such a manner as the capacity of the forming room is not reduced. Subsequently, in a state where the film bodies are separated from the upper platen and/or lower platen on which at least the cooling means is provided, by releasing both film bodies from the respective platens and reducing the capacity of the forming room, the material to be formed is pressurized by both film bodies and at the same time heated. Eventually the material to be formed is laminated each other. After that, when the laminated products are cooled by operating the film bodies in such a manner as the laminated products contact tightly between the upper or the lower platen on which the cooling means is provided, the temperature of each material to be formed descends uniformly, and the material to be formed shrinks thermally and is stabilized without forming any wrinkle. Further, since the radiation temperature in the forming room is removed, the material to be formed is never heated before being pressurized.

DETAILED DESCRIPTION OF THE PREFERRED EMBODIMENTS

Figure 1:
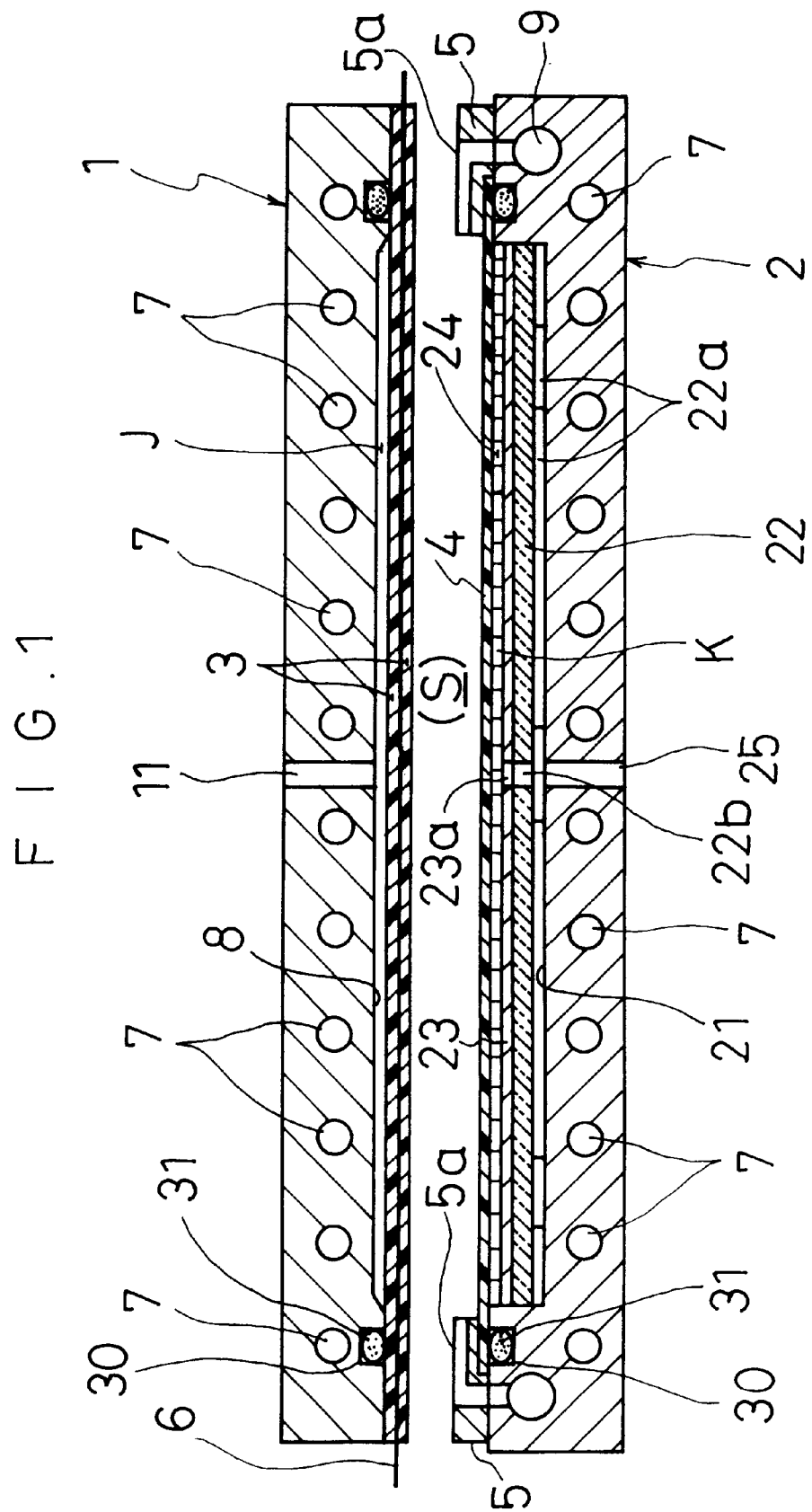
FIG. 1 is a sectional view of an embodiment of vacuum lamination device of the present invention.

First, one embodiment of the present invention is explained based on FIG. 1. For reference, in the figure identical signs show the identical parts or the parts corresponding to the identical parts.

The vacuum lamination device comprises, in general, an upper platen 1 and a lower platen 2 which are disposed opposing each other and able to come close or be separated, film bodies 3, 4 provided on each of opposing surface of the upper platen 1 and the lower platen 2, a frame 5 which forms a forming room S between the film bodies 3, 4, where a material to be formed is accommodated when the platen 1 and the platen 2 come close, a heating means 6 provided on the upper platen 1 of the film body 3, a recessed portion 8 provided on the opposing surface of the upper platen in such a manner as it keeps a given spacing under the film body 3 provided on the upper platen 1, a cooling means 7 to cool the recessed portion 8, a pressure reducing means (described later) to depressurize the forming room S, a film body operation means (described later) able to control the film bodies 3, 4 in such a manner as the film bodies 3, 4 pressurize, at an arbitrary timing, the material to be formed H accommodated in the forming room S in a state where the material to be formed is separated from the recessed portion 8 and make the laminated material to be formed H contact tightly to the recessed portion 8 of the upper platen 1.

Further, in the vacuum lamination device of the present invention, in addition to the above structure, the heating means 6 is characterized in that it has flexibility able to contact tightly to the recessed portion 8 and rigidity able to function as a base plate at the time of pressurizing the material to be formed H being accommodated in the forming room S.

The upper platen 1 is formed from a rectangular plate, and in this embodiment, on the surface opposing to the lower platen 2 a recessed portion 8 is formed which has an area substantially identical with the area corresponding to the area of an inner opening of the frame 5, around the recessed portion 8 a circumferential edge of the film body 3 having the heating means 6 is mounted. The recessed portion 8 is formed flatly and smoothly in its bottom (upper surface) and the edge of the recessed portion which forms a border with the surface of the upper platen 1 on which the film body 3 is mounted is chamfered. Due to the recessed portion 8, a room J having a given spacing between the upper platen 1 and the film body 3 is formed. Further, in this embodiment, a heating means 6 consists of a plate of stainless steel etc. or a foil which generates heat evenly on its whole surface because of electric resistance by flowing electricity and the surfaces thereof are formed flatly and smoothly. On both surfaces of the heating means 6, a sheet-like film body 3 made of silicon gum or the like with elasticity and flexibility is adhered by sintering or the like. The stainless plate or the like of the heating means 6 has a given rigidity, and accordingly the film body 3 attached thereto does not fall down by its self-weight, and further, as described later, it becomes able to function as the base plate at the time of pressurizing the material to be formed, which is accommodated in the forming room S in the state where it is separated from the upper platen 1 provided with the cooling means 7. In addition, the stainless steel plate or the like as the heating means 6 has a given flexibility under which it can contact tightly to the upper surface of the recessed portion 8 by the later mentioned film body operating means. The film body 3 and the heating means 6 are not limited to this for example, the stainless steel plate 6 as a heating means is mounted around the recessed portion 8 of the upper platen 1 through an insulator, under which the film body 3 can be attached. Further, in place of the film body 3 and the heating means 6, a so-called rubber heater having a plate-like reinforcing member can be used.

Inside the upper platen 1, a flowing channel 7 as a cooling means which is supplied with a cooling medium such as cooling water is formed, and at approximately central portion of the upper platen 1, a film body operating path 11 is provided in such a manner as it is opened to the recessed portion 8. To the film body operating path 11, a conduit (not shown) supplying/draining the film body operating fluid for operating the film body 3 by the film body operating means is connected.

The lower platen 2 consists, as well as the upper platen 1, of a rectangular plate, which is thicker than the upper platen 1. On the upper surface of the lower platen 2, a recessed portion 21 having an area smaller than the opening of the frame 5 is formed. Between the film body 4 and the recessed portion 21 a room K is formed. And, in this embodiment, the lower platen 2 also is provided inside with a flowing channel 7 for a coolant as a cooling means as well as the platen 1. In this embodiment, one of the upper and lower platens 1,2 is supported fixedly and to or from the fixed one the other one can come close or be separated, or both platens can be supported in such a manner as both come close mutually or are separated from each other.

In the room K, a heat insulating member 22 and a heating means 23 and a film body operating fluid dispersion member 24 are in turn accommodated. The heating means 23 is, in this embodiment, what generates heat by supplying an electric current, and the same as the plate-like or foil-like heating means 6 made of stainless or the like, which is formed by being attached to the film body 3, or others can be used. At approximate center portion of the lower platen 2, a film body operating path 25 is provided so as to open to the recessed portion 21 and the insulating member 22 and the heating means 23 are provided with a hole 22b and a hole 23a respectively so as to be communicated with the film body operating path 25. The film body operating path 25 is connected by a conduit (not shown) to which the film body operating fluid to operate the film body 4 due to the film operating means for operating the film body 4 is supplied and drained. Further, between a side wall surface of the recessed portion 21 and circumferential sides of the heat insulating member 22 and the heating member 23, a gap (not shown) having a given width is formed on all the circumference. On the contact surface of the heat insulating member 22 to the lower platen 2 a plurality of lattice-like grooves 22a are formed in such a manner as the grooves 22a are opened to the circumferential side of the heat insulating member 22 and are in communication with the film body operation path 25. The film body operating fluid dispersing member 24 is formed in a size spreading approximately all over the recessed portion 21 in such a manner it forms a continuous plane on the upper surface of the lower platen 2, for example, it consists of a porous plate such as a punching metal. The film body operating fluid supplied and drained through the film body operating path 25 by the film body operating means, as mentioned later, circulates through the holes 22b, 23a penetrated in the heat insulating member 22 and the heating means 23 and the gap having a given width formed all over the circumference between the side wall surface of the recessed portion 21 and the circumferential sides of the heat insulating member 22 and the heating means 23 through the lattice like grooves 22a formed on the heat insulating member 22, and spreads evenly to all over the film body 4 through the film body operating fluid dispersion member 24. For reference, in this embodiment, based on the case where the lattice like grooves 22a are formed in the heat insulating member 22 an explanation is carried out, but it is not limited to that if the constitution is formed in such a manner as the gap formed all over the circumference between the side wall surface of the recessed portion 21 and the circumferential sides of the heat insulating member 22 and the heating means 23 can be in communication with the film body operating path 25, like by forming lattice like grooves on the contact surface of the heat insulating member 22 of the lower platen 2.

In this embodiment, the film body 4 is adhered by sintering or the like in such a manner that an outer circumferential edge of the film body 4 covers the inner circumferential opening of the frame 5 in the state where the film body 4 is in contact with the film body operating fluid dispersion member 24 or separated slightly therefrom. The frame 5 is mounted detachably on the lower platen 2. The frame 5 has a path 5a to be opened to its inner circumferential edge. In the lower platen 2, an exhausting path 9 connected to a pressure reduction means such as the vacuum pump or the like (not shown) is formed so as to be in communication with the path 5a.

In portions corresponding to the frame 5, which are provided in the outer circumferences of the recessed portion 8 of the upper platen 1 and the recessed portion 21 of the lower platen 2, annular grooves 30 are formed, respectively. Packing members 31 are provided in the annular grooves 30, respectively. From the above structure, spaces J and K are kept fluid tightly.

The film body operating means, for instance in the case where air is used as a film body operating fluid, comprises an air compressor to supply the film body operating path 11 of the upper platen 1 and the film body operating path 25 of the lower platen 2 with air, a vacuum pump to suck the air from the film body operating paths 11 and 25 and a controlling means to control the air compressor and the vacuum pump at an arbitrary timing in such a manner as they can supply the film body operating paths 11, 25 independently and respectively with air and suck them (not shown).

The vacuum pump as the film body operating means lets the film body 3 and the film body 4 contact tightly on the upper surface of the recessed portion 8 and the film body operating fluid dispersion member 24, respectively, by sucking the air in the room J between the film body 3 and the recessed portion 8 and the room K between the film body 4 and the recessed portion 21 for preventing the film bodies 3 and 4 from swelling to pressurize the material to be formed H inadvertently. Further, the air compressor as a film body operating means supplies the rooms J and K with air and makes the film bodies 3 and 4 swell to pressurize the material to be formed H at a given pressure. Subsequently, the control means as a film body operating means is controlled in such a manner as the suction and supply of the air in the rooms J and K are carried out so as to pressurize the material to be formed in the forming room S in the state where the film bodies 3 and 4 are separated from the upper platen 1 and the lower platen 2 provided with the cooling means 7, then the laminated material to be formed is pressurized to the recessed portion 8 of the upper platen 1 provided with the cooling means 7 and cooled.

For reference, according to the necessary pressure to the material to be formed H, there is a case where a reduction of the pressure in the forming room S is sufficient together with merely opening the rooms J and K to the ambient air, in that case, there is no need of operation of the compressor or existence thereof.

For reference, the material to be formed H which is laminated according to the present invention, for instance, as the case where a film-like photoresist-forming layer consisting of a supporting body film and a photo-sensitive layer is laminated on a lamination substrate or a flexible lamination substrate, is formed from a plurality of plate-like, a continuous sheet-like or film-like material, and it may consist of a combination of thermoplastic or thermo-setting resin films themselves, of the film and a sheet made of a substrate, for instance, a wood plate, a metal plate, or a material of organic, inorganic or any composite. Further, the lamination of the above film-like materials may be from two- or three-layers or more of identical layer or different layer, and the lamination of the film-like material to the substrate may be carried out on merely one side of the substrate or both sides thereof.

Further, the vacuum lamination device of the present invention, is not limited to the above embodiment, depending on the condition of such as temperature appropriate to the material to be formed H, there may be cases where there is merely the heating means 6 adhered on the film body 3 without a heating means 23 and a flowing channel 7 to circulate and supply with a coolant is provided merely on the upper platen 1 and not on the lower platen 2 (see FIG. 2 to FIG. 11). Further, the vacuum lamination device of the present invention, the upper platen 1 and the lower platen 2 may be provided reversely. That is, the recessed portion 21 and the exhaustion path 9 are provided in the upper platen 1, inside the recessed portion 21 the heat insulating member 22, the heating means 23 and the film body operating fluid dispersion member 24 are accommodated, on the lower surface of the upper platen 1 the frame 5 adhered by the film body 4 is provided removably and the lower platen 2 is provided with the recessed portion 8 and the film body 3 fixed by the heating means 6.

Next, a vacuum lamination method according to the present invention is explained based on the above-constituted vacuum lamination device referring to FIGS. 2 to 11. For reference, since FIGS. 2 to 11 are shown in general about the vacuum lamination device as shown in FIG. 1, if, in the following explanation, corresponding signs are not found out in FIGS. 2 to 11, refer to FIG. 1. In this embodiment, an explanation is carried out in the case where air is used as a film body operating fluid. And, in FIGS. 2 to 11, a state where the film body operating means and the pressure reduction means make the film body operating paths 11, 25 and the exhausting path 9 be in communication with ambient air (not operating) is shown by an arrow a, and a state where air is sucked is shown by an arrow b. Further, a state where air is supplied or in communication with ambient air in such a manner as the forming room S is contracted due to the film body operating means is shown by an arrow c.

In the vacuum lamination method according to the present invention, in general, it comprises a process of disposing a material to be formed H between the film bodies 3, 4 provided on the opposing surfaces of the upper platen 1 and the lower platen 2 which are opposing with each other and come close or are separated, a process of making both come close and form a forming room S in which the material to be formed H is accommodated, a process of depressurizing the forming room S without reduction of the capacity of the room S, a process of pressurizing the material to be formed H by the film bodies 3 and 4 in the state where the film bodies 3 and 4 are separated from the upper platen 1 and/or the lower platen 2 which are always cooled by the cooling means 7, a process of heating the material to be formed H and a process of operating the film bodies 3 and 4 in such a manner as the material to be formed H contacts tightly and are cooled between the upper platen 1 or the lower platen 2 provided with a cooling means 7.

Figure 2:
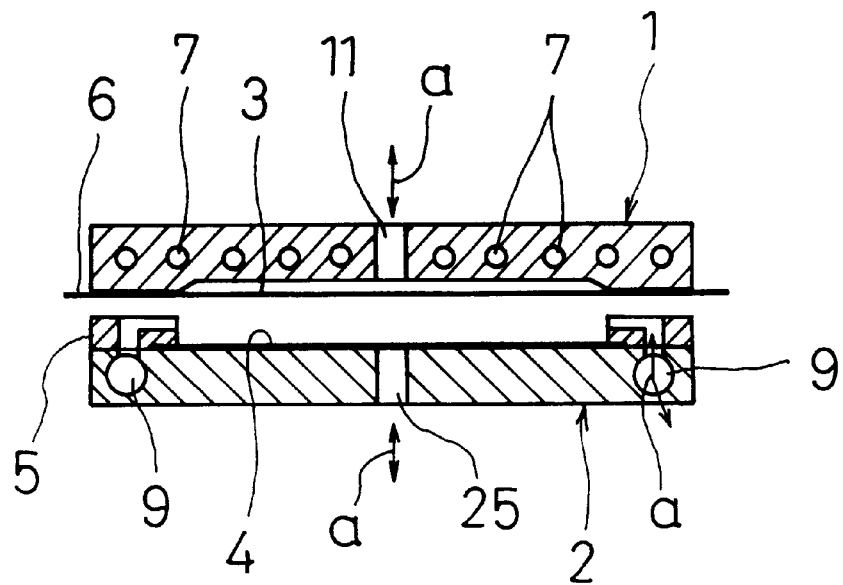
FIG. 2 shows an embodiment of the present invention, in particular a sectional view of the lamination device when it begins a vacuum lamination.

As shown in FIG. 2, at first, the upper platen 1 and the lower platen 2 are separated mutually. The film body operating paths 11, 25 and the exhausting path 9 are, as shown in an arrow a, in communication with ambient air. Since the film body 3 is adhered with a stainless steel plate 6 having a given rigidity as a heating means, the film body 3 does not fall down with its self-weight. To the flowing channel 7 provided on the upper platen 1 a coolant such as water is always circulated and supplied.

Figure 3:
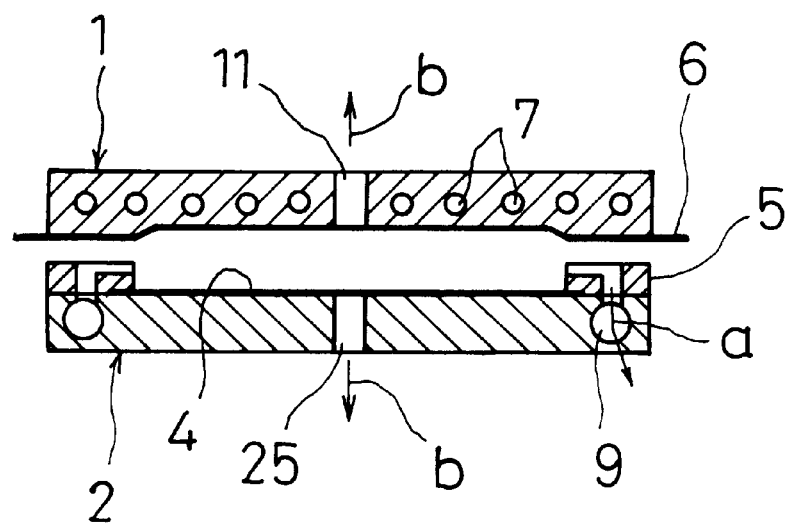
FIG. 3 is a sectional view showing a state where both film bodies are respectively in contact tightly to the upper and lower platens from the state of FIG. 2.

From this state, as shown in an arrow b by FIG. 3, by depressurizing the room J between the film body 3 and the recessed portion 8 and the room K between the film body 4 and the recessed portion 21 by sucking the air therein through the film body operating paths 11, 25 due to the film body operating means, the film body 3 contacts tightly to the upper surface of the recessed portion 8 and the film body 4 is contacted tightly to the film body operating fluid dispersion member 24. The air in the room K, as shown in FIG. 1, through the film body operating fluid dispersion member 24, is sucked through the hole 22b and the hole 23a penetrated in the heat insulating member 22 and the heating means 23, respectively, and the groove 22a formed in the heat insulating member 22 in communication with the gap having a given width and formed all over between the side wall surface of the recessed portion 21 and the circumferential sides of the heat insulating member 22 and the heating means 23. Thereby, the film body 4 contacts tightly and evenly to all over the film body operating fluid dispersion member 24. For reference, the contacting tightly of the film body 3 to the upper surface of the recessed portion 8 and the contacting tightly of the film body 4 to the film body operating fluid dispersion member 24 may be carried out by the time of later mentioned depressurization of the forming room S.

Figure 4:
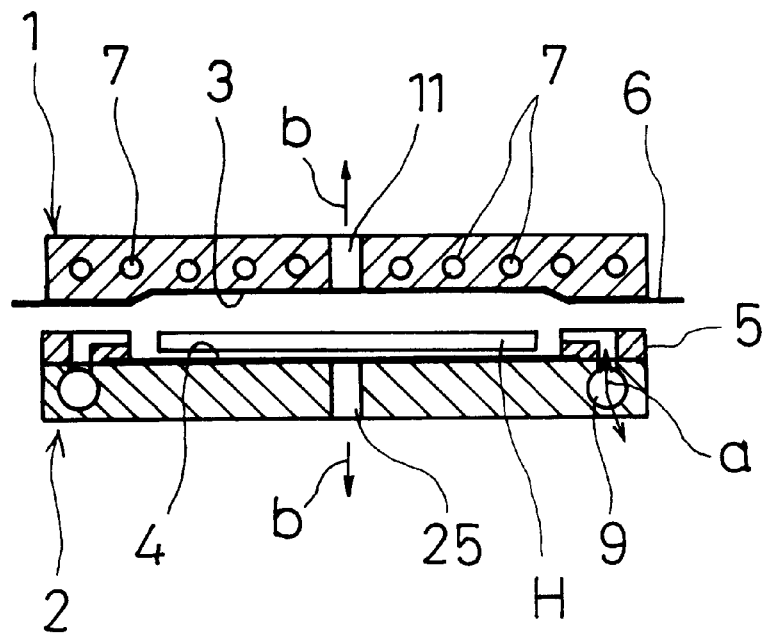
FIG. 4 is a sectional view of a state where the material is carried in from the state of FIG. 3.

Then, as shown in FIG. 4, the materials to be formed H are carried into the frame 5. The materials to be formed H which are to be laminated are, in a state where they come close but separated mutually or contact each other, supported by a continuous film (not shown) or are carried therein in the state of the material to be formed H having a length merely able to be carried in. If the materials to be formed H are not laminated mutually, according to the necessity, a plurality of identical or different materials to be formed H can be carried in the frame 5.

Figure 5:
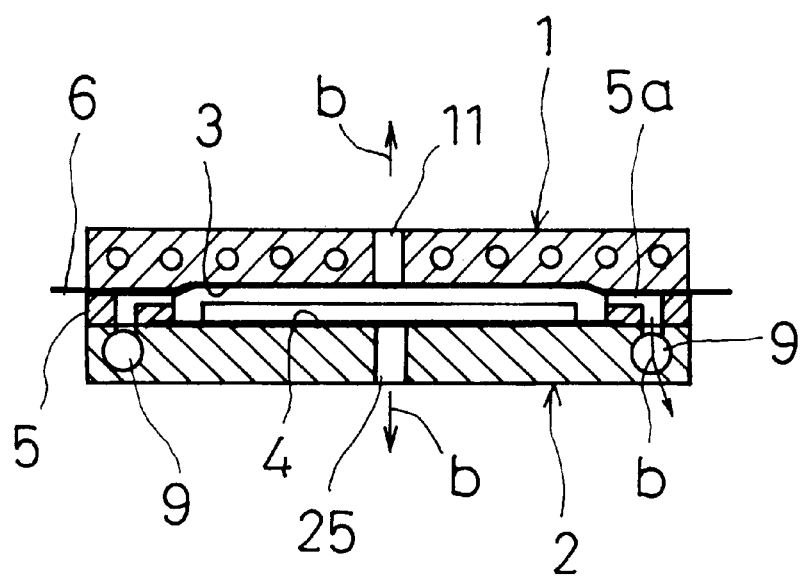
FIG. 5 is a sectional view of a state where, from the state of FIG. 4, a forming room for accommodating the material to be formed is formed by having the upper platen and the lower platen to come close and is depressurized without reducing the capacity of the forming room.

Subsequently, as shown in FIG. 5, the upper platen 1 and the lower platen 2 are displaced in such a manner as they come close to each other, by the film bodies 3, 4 and the frame 5 the forming room S is formed. At that time, the forming room S is sealed air-tight by the film body 3 having elasticity and flexibility, which abuts to the frame 5. In that state, the forming room S is depressurized, as shown in an arrow b, by sucking the air from the exhausting path 9 through the path 5a of the frame 5. This depressurization of the forming room S is maintained until finishing the process of laminating-forming and just before separating the upper platen 1 and the lower platen 2. At that time, since the film bodies 3, 4 contact tightly to the upper surface of the recessed portion 8 and the film body operating fluid dispersion member 24 respectively, the capacity of the forming room S is not reduced, accordingly the material to be formed H is not pressurized.

Figure 6:
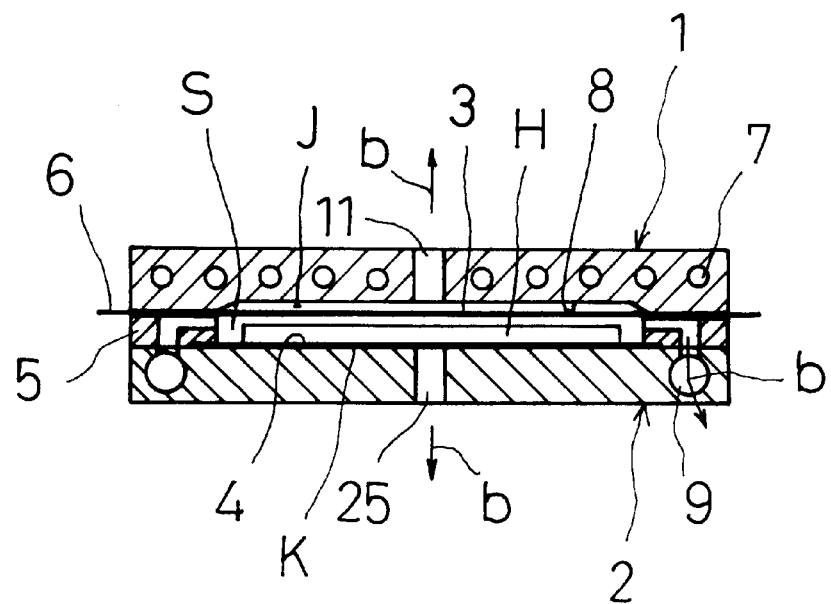
FIG. 6 is a sectional view of a state where, from the state of FIG. 5, a film body is released from the bottom of a recessed portion by depressurization and a room J is formed.
Figure 7:
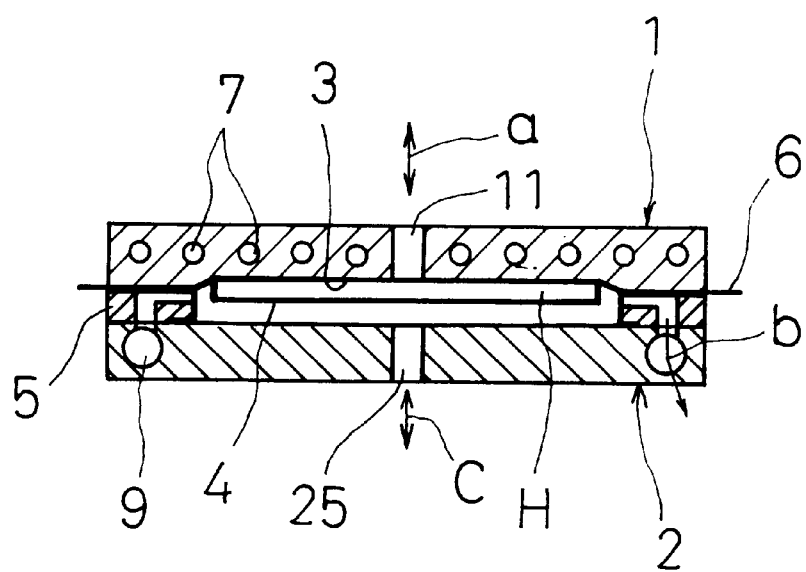
FIG. 7 is a sectional view of a state where, from the state of FIG. 6 the suction of the room J of the upper platen is released by a film body operation means and a film body operation fluid is supplied to a room K of the lower platen.

When the forming room S is depressurized to the same extent to the rooms J and K, as shown in FIG. 6, the film body 3 is adapted to be separated from the upper surface of the recessed portion 8. From this state, as shown in FIG. 7, the room J becomes in communication with ambient air (arrow a) through the film body operating path 11 by the film body operating means, and the air is supplied to the room K (arrow c) through the film body operating path 25. The air supplied to the room K, as shown in FIG. 1, is adapted to effect the film body 4 to swell evenly by the film body operating fluid dispersion member 24 through the holes 22b, 23a penetrated in the heat insulating member 22 and the heating means 23 respectively, and the gap having a given width and being formed through a lattice like groove 22a formed in the heating member 22 all over between the side wall surface of the recessed portion 21 and the circumferential sides of the heat insulating member 22 and the heating means 23. Under these operations, the material to be formed H is pressurized to the upper surface of the recessed portion 8 through the film body 3 by the film body 4. Since a coolant such as water is always circulated and supplied to the flowing path 7 as a cooling means provided in the upper platen 1 and at this time an electric current is not yet applied to the stainless steel plate 6 as the heating means, even if heat remains in the material to be formed H and the film body 3, it is removed. Therefore, there is no anxiety in which thermoplasticization or thermosetting by being heated is advanced too much before being pressurized, and some wrinkles are generated or the precision of positioning is deteriorated.

Subsequently, as shown in arrow c of FIG. 8, the air under the same pressure as in the room K is supplied to the room J through the film operating path 11 by the film operating means, and a given electric current is applied to the stainless steel plate 6 as a heating means. The film body 3 is separated from the upper surface of the recessed portion 8 which is cooled by the coolant which always circulates and is supplied to the path 7 under the pressure of the air supplied in the room J. And, the stainless steel plate 6 generates heat due to an electric resistance to be increased to the predetermined temperature evenly all over the surface thereof. Thereby, the material to be formed H is pressurized between the film bodies 3 and 4 and heated by the heat generation of the stainless steel plate 6. Then, as described above, since the stainless steel plate 6 has a given rigidity, the surface thereof is formed flatly and smoothly and it functions as the conventional heating plate, the material to be formed H is adapted to be stably heated and pressurized in a state where it is separated from the upper platen 1 provided with the path 7. This heating and pressurization continues for a predetermined time duration. Since the stainless steel plate 6 is heated by applying an electrical current thereto while the film body 3 is separated from the recessed portion 8 which is cooled by the circulating coolant in the flowing path 7, the heating capacity can become quite small.

Figure 8:
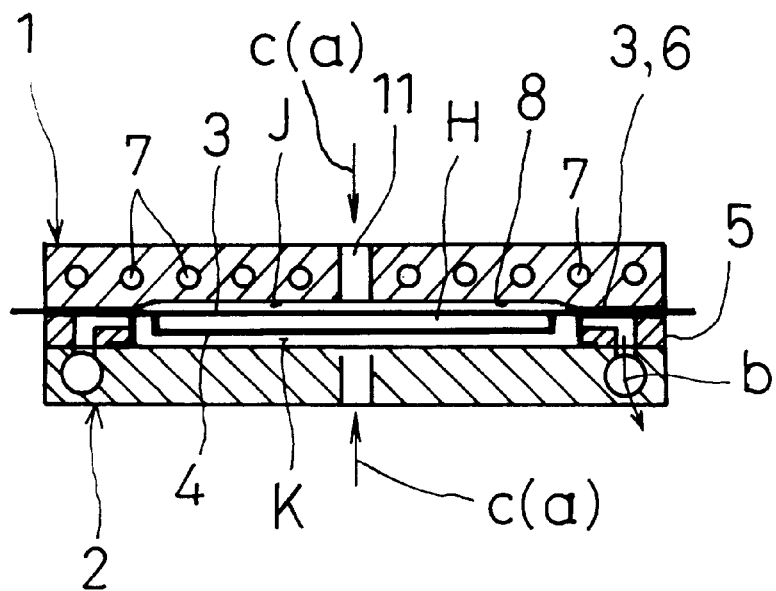
FIG. 8 is a sectional view of a state where, from the state of FIG. 7, the film body operation fluid is supplied to the room J of the upper platen too by the film body operation means, and the material to be formed is pressurized and heated while releasing the material to be formed from the recessed portion cooled by the cooling means.

For reference, depending on the pressure force of being pressurized to the material to be formed H, as shown in (a) of FIG. 8, the film bodies 3 and 4 can be adapted to pressure the material to be formed H while the rooms J and K being in communication with ambient air through the film body operating paths 11, 25, and through the path 5a provided on the frame 5, merely by the pressure reduction due to depressurization of the forming room S from the exhausting path 9.

Figure 9:
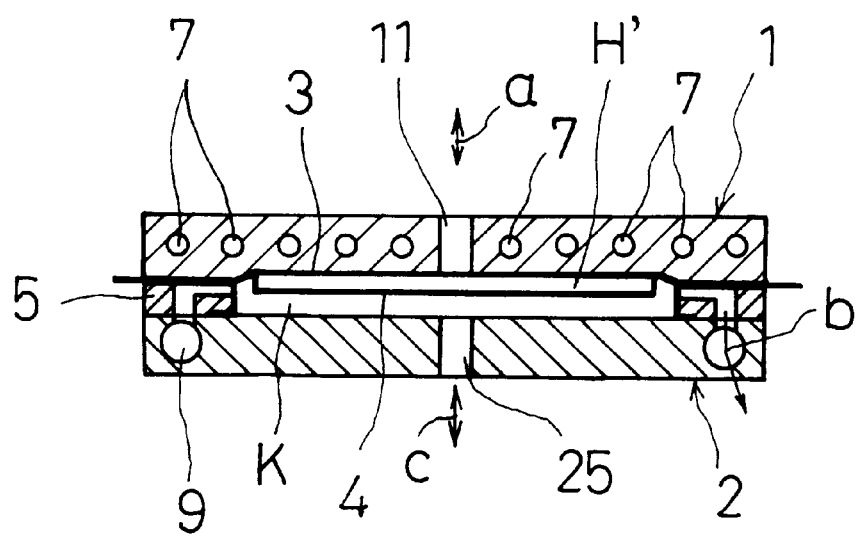
FIG. 9 is a sectional view of a state where, from the state of FIG. 8, the heating by the heating means and the supply of the film body operation fluid to the room J of the upper platen by the film body operation means are stopped, the laminated material to be formed is cooled while being in contact tightly to the recessed portion cooled by the cooling means.

When the material to be formed H is laminated, as shown in FIG. 9, the room J is in communication with ambient air through the film body operating path 11 due to the film body operating means and air is supplied to the room K through the film body operating path 25. Thereby, the laminated products H' formed in which the material to be formed H is laminated are contacted tightly to the upper surface of the recessed portion 8 of the upper platen 1 provided with the flowing path 7 through and to which the coolant always circulates and is supplied by pressurizing the film body 4 through the film body 3 and the stainless steel plate 6, and every material to be formed is evenly decreased in its temperature to be cooled and thermally contracted. This state in cooling the laminated products H' is maintained for a given time duration. Accordingly, the laminated products H' do not generate any wrinkle to be stabilized in the quality and can shorten a forming cycle.

Figure 10:
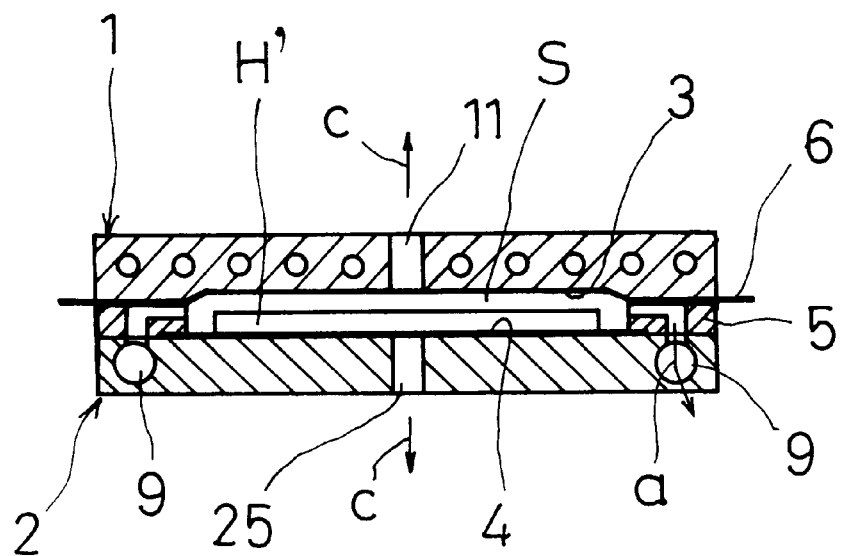
FIG. 10 is a sectional view of a state where, from the state of FIG. 9, both film bodies are in contact tightly to the upper platen and the lower platen, respectively.

Then, as shown in FIG. 10, so as to make the forming room S be in communication with ambient air, air is exhausted from the path 5a of the frame 5 through the exhausting path 9 by the pressure reduction means, and so as to stop the pressurization to the laminated products by the film bodies 3 and 4, the film bodies 3 and 4 are contacted to the recessed portion 8 and the film body operating fluid dispersion member 24 (see FIG. 1) respectively.

Figure 11:
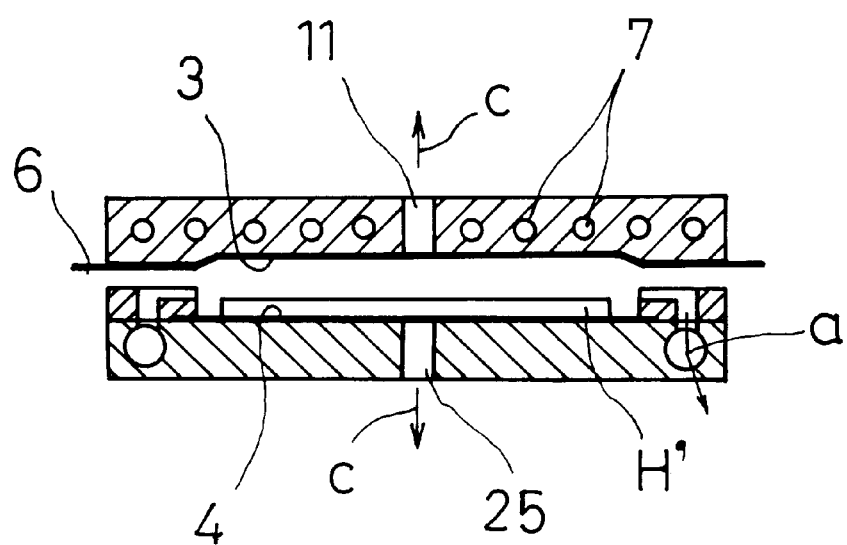
FIG. 11 is a sectional view of a state where, from the state of FIG. 10, the forming room is opened by separating the upper platen and the lower platen.

When the forming room S returns to the same pressure as ambient air, as shown in FIG. 11, the upper platen 1 and the lower platen 2 are displaced in such a manner as they are departed so as to open the forming room S and the laminated products H' are carried out.

For reference, in the embodiment as shown in FIG. 1, the lower platen 2 is also formed with a flowing path 7 to circulate the coolant, and a case where the heating means 23 is provided is also shown. Since the material to be formed H is thick and the stainless steel plate 6 does not generate sufficient heat, the material to be formed H needs to be heated by the heating means 23. And, in this case, when generating the heat on the heating means 23 the circulating and supplying of the coolant to the flowing path 7 of the lower platen 2 is stopped. When the heating means 23 does not generate the heat the coolant is circulated and supplied to the path 7 of the lower platen 2, or even if, when the the heating means 23 generates heat, the coolant is always circulated and supplied to the path 7 of the lower platen 2, thereby, a radiation heat remained in the lower platen 2 due to heating the heating means 23 can be removed.

According to the vacuum laminating device of claim 1, the material to be formed accommodated in the forming room is pressurized, at the time of heating the material to be formed by the heating means, the material to be formed is separated from the recessed portion cooled by the cooling means, after that, the laminated materials on the recessed portion cooled by the cooling means can be contacted tightly by the film body operating member, so that, the lamination of the materials to be formed consisting of a plurality of plates, sheet-like or film-like material may be appropriately carried out depending the temperature condition of the material to be formed, and by which a generation of any wrinkle can be avoided to increase the yield and shorten the lamination cycle.

According to the vacuum laminating device of claim 2, in the invention of claim 1, since the heating means has a flexibility able to contact tightly to the recessed portion and a rigidity able to function as a base plate when pressurizing the material to be formed accommodated in the forming room, it is possible to pressurize the material to be formed securely without deformation and to cool the laminated materials to be formed.

According to the vacuum lamination method of claim 3, in the state where the material to be formed is separated from the upper platen and/or the lower platen in which the cooling means is provided, it is pressurized and heated, after that, it is cooled by the contacting tightly to the upper platen or lower platen provided with a cooling means, and depending on the temperature condition of the material to be formed, the lamination of a plurality of plates, sheet-like or film-like material may be appropriately carried out, and by which a generation of any wrinkle can be avoided to increase the yield and shorten the lamination cycle.

What is claimed is:

1. A vacuum lamination device, comprising:

an upper platen and a lower platen which oppose each other and can be moved close to and be separated from each other;

a film body provided on each of opposing surfaces of the upper platen and the lower platen;

a frame forming a forming room between the film bodies for accommodating a material to be formed when the upper platen and the lower platen are moved close to each other;

a heating means provided on at least one of the film bodies on the upper platen and the lower platen;

a recessed portion formed between the at least one film body on which the heating means is provided and the opposing surface of the at least one of the upper platen and the lower platen provided with the film body, the recessed portion having a given space;

a cooling means to cool the recessed portion;

a pressure reduction means to depressurize the forming room; and a film body operating means to operate the film body controllably such that, at an arbitrary timing, the film body pressurizes a material to be formed which is accommodated in the forming room in a state in which the material to be formed is separated from the recessed portion and laminated materials to be formed tightly contact the recessed portion of at least one of the upper platen and the lower platen.

2. A vacuum lamination device according to claim 1, wherein the heating means is flexible to tightly contact the recessed portion, and the heating means has a rigidity to function as a base plate when pressurizing the material to be formed which is accommodated in the forming room.

3. A vacuum lamination methods comprising:

disposing a material to be formed between film bodies provided on opposing surfaces of an upper platen and a lower platen, respectively, which oppose each other and can be moved close to and be separated from each other, at least one of the upper platen and the lower platen including a cooling means;

forming a forming room for accommodating the material to be formed by moving the upper and lower platens close to each other;

depressurizing the forming room such that the capacity of the forming room is not reduced;

pressurizing the material to be formed by both film bodies in a state in which the material to be formed is separated at least from the at least one of the upper platen and the lower platen including a cooling means;

heating the material to be formed; and operating the film bodies such that the materials to be formed tightly contact the upper platen or the lower platen provided with the cooling means.

4. A vacuum lamination device, comprising, an upper platen having a upper surface and a lower platen having a lower surface opposing the upper surface, the upper platen and the lower platen can be moved close to and separated from each other;

an upper film body on the upper surface of the upper platen;

a lower film body on the lower surface of the lower platen;

a frame that forms a forming room between the upper and lower film bodies for accommodating a material to be formed when the upper platen and the lower platen are moved close to each other;

a heater provided on at least one of the upper film body and the lower film body;

a recessed portion formed between the at least one of the upper film body and the lower film body on which the heater is provided and the upper surface of the upper platen and the lower surface of the lower platen;

a cooling fluid channel for flowing a cooling fluid to cool the recessed portion;

a first device that depressurizes the forming room; and a second device that operates the upper film body and the lower film body in a controlled manner, such that the upper film body and the lower film body pressurize the material to be formed disposed in the forming room in a state in which the material is separated from the recessed portion and laminated materials to be formed tightly contact the recessed portion of at least one of the upper platen and the lower platen.

5. A vacuum lamination device according to claim 4, wherein the heater is flexible to tightly contact the recessed portion, and the heater has a rigidity to function as a base plate when pressurizing the material to be formed which is disposed in the forming room.

* * * * *